(12) United States Patent
Kase et al.

(10) Patent No.: US 8,097,886 B2
(45) Date of Patent: Jan. 17, 2012

(54) ORGANIC ELECTROLUMINESCENCE DEVICE

(75) Inventors: Satoru Kase, Mobara (JP); Yoshinori Ishii, Chiba (JP); Eiji Matsuzaki, Yokohama (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 10 days.

(21) Appl. No.: 12/604,528

(22) Filed: Oct. 23, 2009

(65) Prior Publication Data

US 2010/0102302 A1 Apr. 29, 2010

(30) Foreign Application Priority Data

Oct. 24, 2008 (JP) ................................. 2008-274352

(51) Int. Cl.
*H01L 21/00* (2006.01)
(52) U.S. Cl. .............. 257/78; 257/82; 257/98; 257/100; 257/E21.114; 257/E23.084
(58) Field of Classification Search ..................... 257/13, 257/40, 79–88, 100
See application file for complete search history.

(56) References Cited

U.S. PATENT DOCUMENTS

| | | | |
|---|---|---|---|
| 6,590,337 B1 * | 7/2003 | Nishikawa et al. | 313/509 |
| 6,664,563 B2 * | 12/2003 | Yamada et al. | 257/40 |
| 6,768,258 B2 * | 7/2004 | Kobayashi | 313/504 |
| 6,781,148 B2 * | 8/2004 | Kubota et al. | 257/40 |
| 6,833,668 B1 * | 12/2004 | Yamada et al. | 313/505 |
| 7,053,402 B2 * | 5/2006 | Yoshitomi et al. | 257/40 |
| 7,063,902 B2 * | 6/2006 | Kikuchi et al. | 428/690 |
| 7,097,527 B2 * | 8/2006 | Matsuoka | 445/25 |
| 7,178,927 B2 * | 2/2007 | Seo | 362/84 |
| 7,242,140 B2 * | 7/2007 | Kobayashi et al. | 313/506 |
| 7,276,848 B2 * | 10/2007 | Cok et al. | 313/504 |
| 7,306,346 B2 * | 12/2007 | Fukuoka et al. | 362/84 |
| 7,365,487 B2 * | 4/2008 | Matsuura et al. | 313/506 |
| 7,417,370 B2 * | 8/2008 | Cok et al. | 313/504 |
| 7,436,117 B2 * | 10/2008 | Lee et al. | 313/555 |
| 7,446,472 B2 * | 11/2008 | Matsukaze | 313/506 |
| 7,459,850 B2 * | 12/2008 | Cok | 313/512 |
| 7,466,075 B2 * | 12/2008 | Cok et al. | 313/506 |
| 7,560,858 B2 * | 7/2009 | Nishikawa et al. | 313/292 |
| 7,602,118 B2 * | 10/2009 | Cok et al. | 313/506 |
| 7,648,405 B2 * | 1/2010 | Choi et al. | 445/24 |

FOREIGN PATENT DOCUMENTS

| | | | |
|---|---|---|---|
| EP | 1021070 | * | 7/2000 |
| JP | 2006-080094 | | 3/1920 |

* cited by examiner

*Primary Examiner* — Michael Lebentritt
(74) *Attorney, Agent, or Firm* — Antonelli, Terry, Stout & Kraus, LLP.

(57) ABSTRACT

An organic electroluminescence device which can prevent the deterioration thereof attributed to moisture by preventing a desiccant from influencing organic electroluminescence elements is provided. The organic electroluminescence device includes: first and second substrates which are arranged to face each other in an opposed manner with a gap therebetween; organic electroluminescence elements which are formed on a first surface of the first substrate which faces the second substrate in an opposed manner; a desiccant which is formed on a second surface of the second substrate which faces the first substrate in an opposed manner; and a resin which is adhered to the first and second surfaces and covers the desiccant and the organic electroluminescence elements. The desiccant includes a portion which is arranged outside a region of the second surface which faces the organic electroluminescence elements in an opposed manner and surrounds the whole of the region, and the organic electroluminescence elements are isolated from the desiccant by way of the resin.

6 Claims, 5 Drawing Sheets

ORGANIC ELECTROLUMINESCENCE DEVICE

CROSS-REFERENCE TO RELATED APPLICATIONS

The present application claims priority from Japanese Application JP 2008-274352 filed on Oct. 24, 2008, the content of which is hereby incorporated by reference into this application.

BACKGROUND OF THE INVENTION

1. Field of the Invention

The present invention relates to an organic electroluminescence device.

2. Background Art

Organic electroluminescence elements are, for preventing the deterioration of the elements attributed to moisture, configured such that the hollow structure is formed by a sealing substrate having a recessed portion, and a desiccant is arranged in a hollow inner portion. Further, there has been also known a technique in which organic electroluminescence elements are covered with a resin (see JP-A-2006-80094 (patent document 1)). However, in the structure described in patent document 1, a desiccant is formed on a substrate on which the organic electroluminescence elements are formed and hence, it is difficult to provide the desiccant in a state where the organic electroluminescence elements are not influenced by the desiccant.

SUMMARY OF THE INVENTION

It is an object of the invention to prevent the deterioration of organic electroluminescence elements attributed to moisture by preventing a desiccant from Influencing the organic electroluminescence elements.

(1) According to a first aspect of the invention, there is provided an organic electroluminescence device which includes: first and second substrates which are arranged to face each other in an opposed manner with a gap therebetween; organic electroluminescence elements which are formed on a first surface of the first substrate which faces the second substrate in an opposed manner; a desiccant which is formed on a second surface of the second substrate which faces the first substrate in an opposed manner; and a resin which is adhered to the first and second surfaces and covers the desiccant and the organic electroluminescence elements, wherein the desiccant includes a portion which is arranged outside a region of the second surface which faces the organic electroluminescence elements in an opposed manner and surrounds the whole of the region, whereby the organic electroluminescence elements are isolated from the desiccant by way of the resin. According to the invention, the resin is interposed between the desiccant and the organic electroluminescence elements and hence, the organic electroluminescence elements are not influenced by the desiccant whereby the deterioration of the organic electroluminescence elements by moisture can be prevented.

(2) In the organic electroluminescence device having the constitution (1), the desiccant may be arranged only outside the region of the second surface which faces the organic electroluminescence elements in an opposed manner by avoiding the region.

(3) In the organic electroluminescence device having the constitution (1), the desiccant may include a portion which faces the organic electroluminescence elements in an opposed manner and possesses light-transmitting property.

(4) In the organic electroluminescence device having any one of the constitutions (1) to (3), the organic electroluminescence element may have the structure which emits light in the direction toward the second substrate.

(5) In the organic electroluminescence device having any one of the constitutions (1) to (3), the organic electroluminescence element may have the structure which emits light in the direction toward the first substrate.

DESCRIPTION OF THE PREFERRED EMBODIMENTS

Embodiments of the invention are explained hereinafter in conjunction with drawings.

First Embodiment

Figure 1:
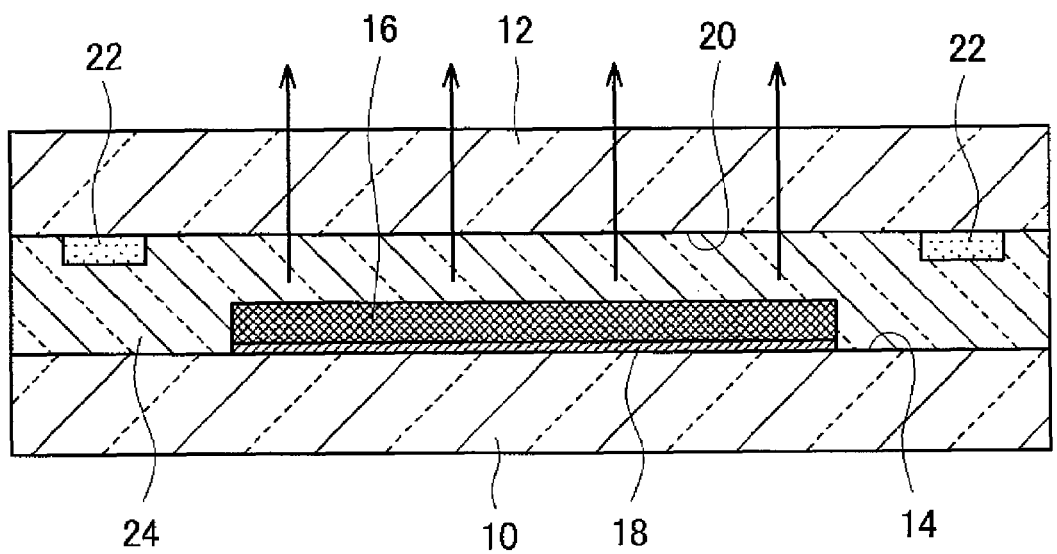
FIG. 1 is a view for explaining an organic electroluminescence device according to a first embodiment of the invention.

FIG. 1 is a view for explaining an organic electroluminescence device according to the first embodiment of the invention. The organic electroluminescence device includes first and second substrates 10, 12 which face each other in an opposed manner with a gap formed therebetween. The first and the second substrates 10, 12 may be formed of a glass substrate or a resin substrate. However, at least one of the substrates (through which light is allowed to pass) has light-transmitting property. The first and the second substrates 10, 12 may be flat or curved.

Organic electroluminescence elements 16 are formed on a first surface 14 of the first substrate 10 which faces the second substrate 12 in an opposed manner. The organic electroluminescence element 16 has a cathode, an anode and a light emitting layer which is sandwiched between these electrodes not shown in the drawing, and the light emitting layer may be sandwiched between an electron transport layer and a hole transport layer. Further, an electron injection layer may be arranged between the electron transport layer and the cathode, and a hole injection layer may be arranged between the hole transport layer and the anode.

TFTs (Thin Film Transistors) and lines not shown in the drawing are formed on the first surface 14 of the first substrate 10 which faces the second substrate 12 in an opposed manner and hence, the first substrate 10 may be referred to as a TFT substrate.

The organic electroluminescence element 16 is configured to emit light in the direction toward the second substrate 12. In FIG. 1, in the organic electroluminescence element 16, a reflection mirror 18 is arranged at a position closer to the first substrate 10 than a cathode and an anode (not shown in the drawing). However, this embodiment is not limited to this structure.

A desiccant 22 is formed on a second surface 20 of the second substrate 12 which faces the first substrate 10 in an opposed manner. The desiccant 22 includes a portion which is arranged outside a region of the second surface 20 which faces the organic electroluminescence elements 16 in an opposed manner and surrounds the whole of the region. The desiccant 22 is arranged only outside the region of the second surface 20 which faces the organic electroluminescence elements 16 in an opposed manner by avoiding such a region. Accordingly, the desiccant 22 does not obstruct transmission of light and hence, a material having low light-transmitting property (or non-light-transmitting property) (for example, zeolite) can be used.

A resin 24 (for example, an epoxy resin) is adhered to the first surface 14 and the second surface 20 and covers the desiccant 22 and the organic electroluminescence elements 16. The resin 24 completely seals a space defined between the first and the second substrates 10, 12 and outside the desiccant 22. The resin 24 has light-transmitting property. The resin 24 forms an adhesive layer for making the first and the second substrates 10, 12 adhered to each other. The resin 24 also functions as a sealing layer for the organic electroluminescence elements 16. The resin 24 may be also referred to as filler which is filled in the space defined between the first and the second substrates 10, 12. In this case, a seal (not shown in the drawing) may be provided between the first and the second substrates 10, 12 and around the resin 24 for surrounding the space. The organic electroluminescence elements 16 are isolated from the desiccant 22 by way of the resin 24.

According to this embodiment, the resin 24 is interposed between the desiccant 22 and the organic electroluminescence elements 16 and hence, the desiccant 22 does not influence the organic electroluminescence elements 16 thus preventing the deterioration of the organic electroluminescence element 16 attributed to moisture. Further, the resin 24 forms a continuous layer between the first and the second substrates 10, 12 and hence, strength of the organic electroluminescence device can be increased. This increase of strength is effective in the manufacture of a large-sized organic electroluminescence device.

Figure 2A:
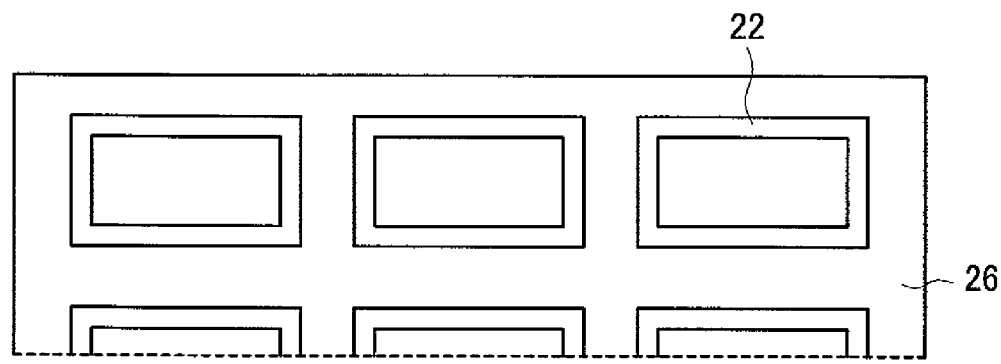
FIG. 2A to 2C are views for explaining a manufacturing method of the organic electroluminescence device according to this embodiment.
Figure 2B:
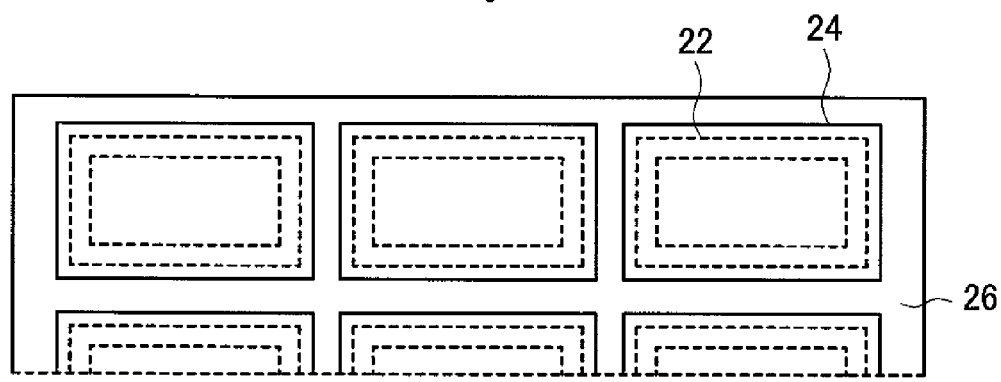
Figure 2C:
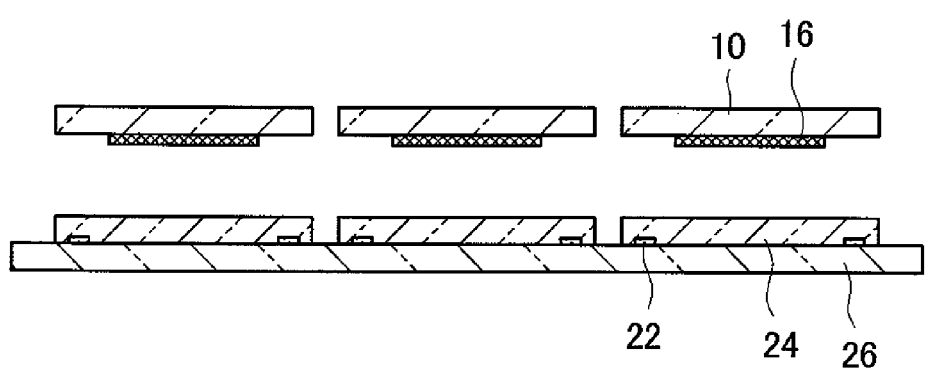

FIG. 2A to FIG. 2C are views for explaining a manufacturing method of the organic electroluminescence device according to this embodiment. In this embodiment, the above-mentioned first substrates 10 and a base substrate 26 are prepared. A plurality of second substrates 12 (see FIG. 1) are obtained by cutting the base substrate 26.

As shown in FIG. 2A, desiccants 22 are provided to the base substrate 26. The desiccants 22 are provided in a frame shape such that the desiccant 22 surrounds each of a plurality of regions (light transmitting areas) formed on the base substrate 26 continuously without a cutaway portion. The desiccants 22 may be provided by any one of the methods consisting of coating, printing and adhesion.

As shown in FIG. 2B, the resins 24 are provided. The plurality of resins 24 are provided so as to cover a plurality of respective regions surrounded by the desiccants 22. That is, the plurality of resins 24 are provided such that one resin 24 covers one desiccant 22. Each resin 24 is formed on the base substrate 26 inside the frame-shaped desiccant 22. Each resin 24 is formed such that each resin 24 reaches the outside of one desiccant 22 (outside the light transmitting area). Each resin 24 is formed integrally (without cutaway portion) from a region surrounded by one desiccant 22 to the outside of the desiccant 22. The resin 24 has a thickness larger than a thickness of the desiccant 22. The resin 24 may be prepared in a sheet shape. In this case, the resin 24 may be adhered to the base substrate 26 by compression bonding using a roller.

As shown in FIG. 2C, the first substrates 10 are arranged above the resins 24 such that the organic electroluminescence elements 16 (at least light emitting layers) face a region inside the desiccant 22 in an opposed manner, and the first substrates 10 are adhered to the resins 24 respectively. Thereafter, organic electroluminescence devices are obtained by cutting the base substrate 26. The organic electroluminescence device may be used as a display device as well as a lighting appliance.

Second Embodiment

Figure 3:
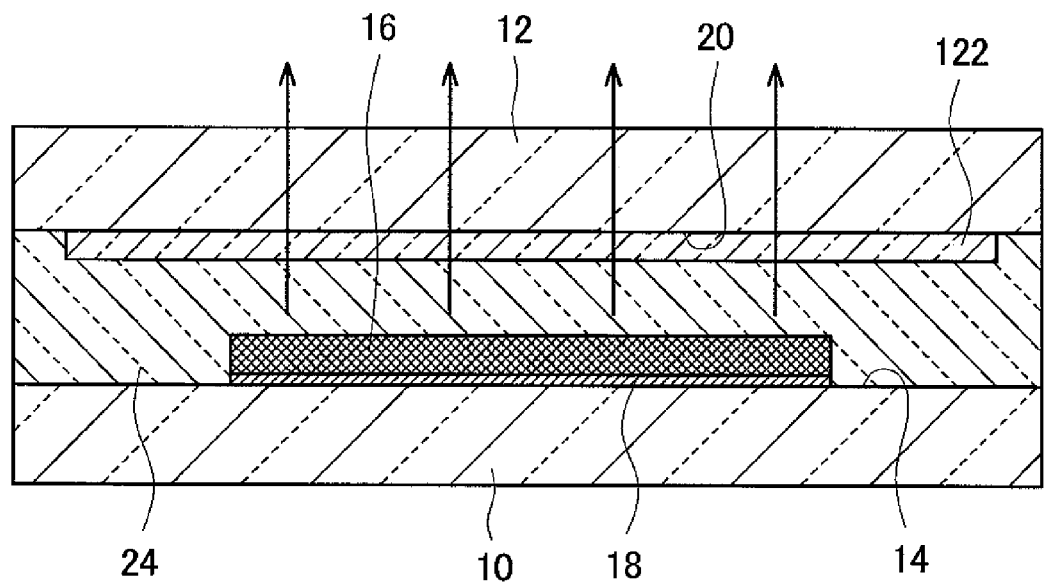
FIG. 3 is a view for explaining an organic electroluminescence device according to a second embodiment of the invention.

FIG. 3 is a view for explaining an organic electroluminescence device according to the second embodiment of the invention. In this embodiment, a desiccant 122 includes a portion which faces organic electroluminescence elements 16 (at least light emitting layers) in an opposed manner and has light-transmitting property. The whole desiccant 122 may have light-transmitting property. This embodiment is substantially equal to the first embodiment with respect to other constitutions. This embodiment can also acquire the manner of operation and advantageous effects explained in conjunction with the first embodiment.

Figure 4A:
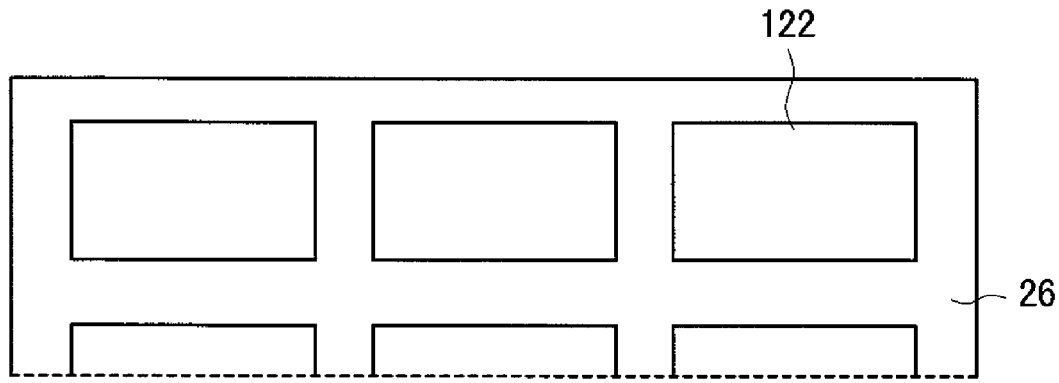
FIG. 4A to 4C are views for explaining a manufacturing method of the organic electroluminescence device according to this embodiment.
Figure 4B:
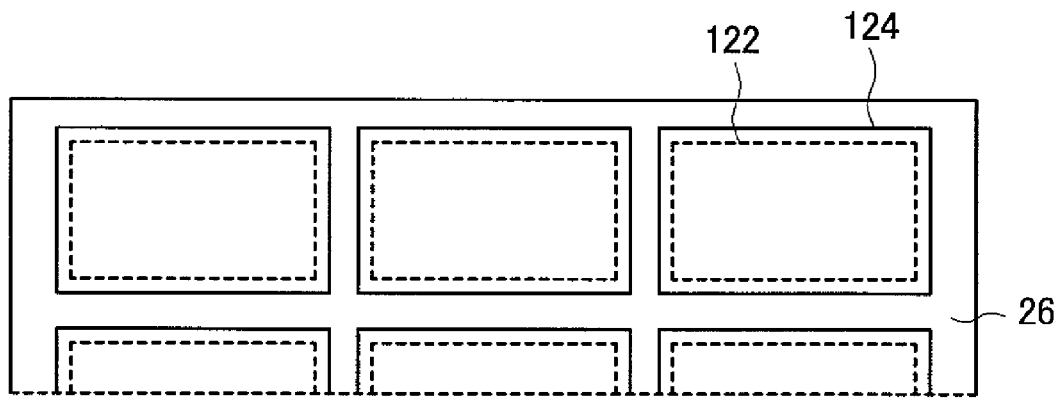
Figure 4C:
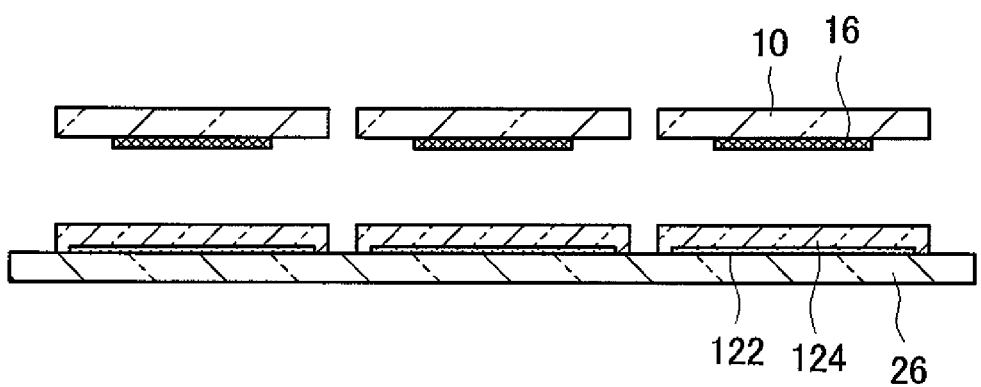

FIG. 4A to 4C are views for explaining a manufacturing method of the organic electroluminescence device according to this embodiment. In this embodiment, the first substrate 10 and the base substrate 26 explained in conjunction with the first embodiment are prepared.

As shown in FIG. 4A, desiccants 122 are provided to the base substrate 26. The pluralities of desiccants 122 are provided so as to cover a plurality of respective regions (light transmitting areas) formed on the base substrate 26. One desiccant 122 completely covers the whole of one region (light transmitting area).

As shown in FIG. 4B, resins 124 are provided. The pluralities of resins 124 are provided so as to cover the plurality of desiccants 122 respectively. One resin 124 is provided so as to cover one desiccant 122. Each resin 124 is provided such that the resin 124 reaches the outside of one desiccant 122. Each resin 124 does not have a hole.

As shown in FIG. 4C, the first substrates 10 are formed on the resins 124 respectively such that the organic electroluminescence element 16 (at least light emitting layers) faces the desiccant 122 in an opposed manner, and the first substrates 10 are adhered to the resins 124. Thereafter, organic electroluminescence devices are obtained by cutting the base substrate 26. The second embodiment is substantially equal to the first embodiment with respect to other steps of the manufacturing method.

(Modification)

Figure 5:
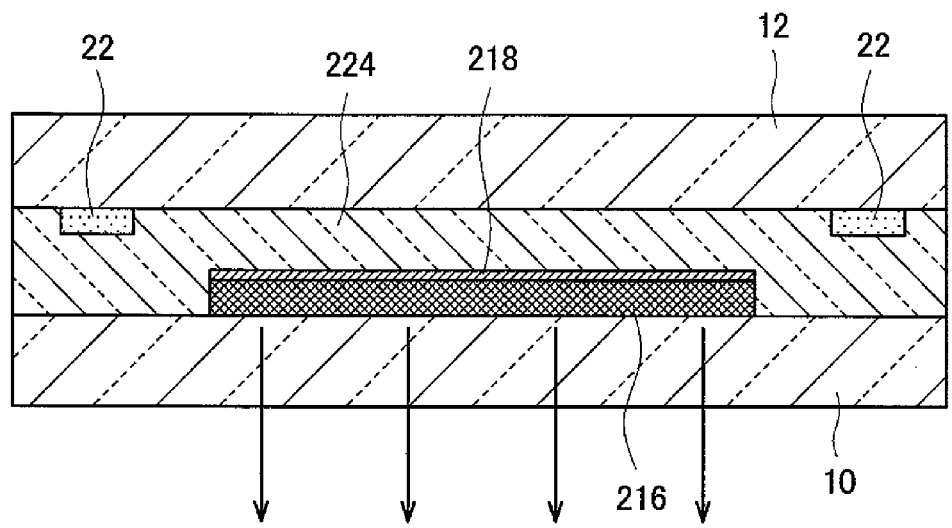
FIG. 5 is a view showing a modification of the organic electroluminescence device according to the first embodiment.

FIG. 5 is a view showing a modification of the organic electroluminescence device according to the first embodiment. In this embodiment, a resin 224 has light blocking property (having low light-transmitting property or non-light-transmitting property). Accordingly, organic electroluminescence elements 216 have the structure which emits light in the direction toward the first substrate 10. For example, in FIG. 5, in the organic electroluminescence element 216, a reflection mirror 218 is arranged at a position closer to the second substrate 12 than a cathode and an anode. However, this modification is not limited to such structure. This modification is substantially equal to the first embodiment with respect to other constitutions and the manufacturing method, and can acquire the substantially same manner of operation and advantageous effects explained in conjunction with the first embodiment.

Figure 6:
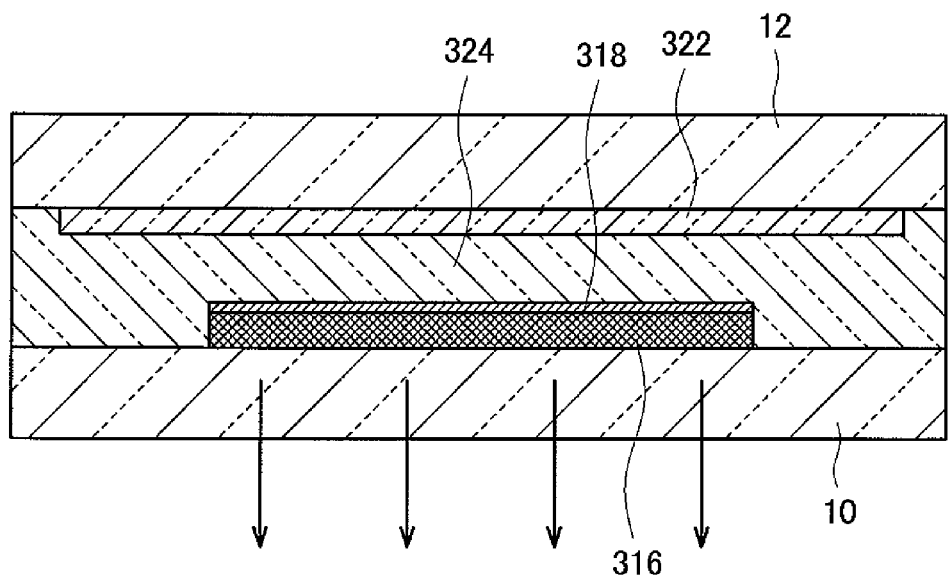
FIG. 6 is a modification of the organic electroluminescence device according to the second embodiment.

FIG. 6 is a view showing a modification of the organic electroluminescence device according to the second embodiment. In this embodiment, a resin 324 has light blocking property (having low light-transmitting property or non-light-transmitting property). Accordingly, organic electroluminescence elements 316 have the structure which emits light in the direction toward the first substrate 10. For example, in FIG. 6, in the organic electroluminescence element 316, a reflection mirror 318 is arranged at a position close to the second substrate 12 than a cathode and an anode. However, this modification is not limited to such structure. Further, a desiccant 322 may not have light-transmitting property. This modification is substantially equal to the second embodiment with respect to other constitutions and the manufacturing method, and can acquire the substantially same manner of operation and advantageous effects explained in conjunction with the second embodiment.

The invention is not limited to the above-mentioned embodiment, and various variations of the invention are conceivable. For example, the constitutions explained in conjunction with the embodiments may be replaced with the substantially equal constitution, the constitution which can acquire the substantially same manner of operation and advantageous effects or the constitution which can achieve the same object.

What is claimed is:

1. An organic electroluminescence device comprising:
   first and second substrates which are arranged to face each other in an opposed manner with a gap therebetween;
   organic electroluminescence elements which are formed on a first surface of the first substrate which faces the second substrate in an opposed manner;
   a desiccant which is formed on a second surface of the second substrate which faces the first substrate in an opposed manner; and
   a resin which fills the gap between the first and second substrates, the resin being adhered to the first and second surfaces and extending over and covering the desiccant and the organic electroluminescence elements, wherein
   the desiccant includes a portion which is arranged outside a region of the second surface which faces the organic electroluminescence elements in an opposed manner and surrounds the whole of the region of the second surface, whereby
   the organic electroluminescence elements are isolated from the desiccant by way of the resin.

2. An organic electroluminescence device according to claim 1, wherein the desiccant is arranged only outside the region of the second surface which faces the organic electroluminescence elements in an opposed manner by avoiding the region.

3. An organic electroluminescence device according to claim 1, wherein the desiccant includes a portion which faces the organic electroluminescence elements in an opposed manner and possesses light-transmitting property.

4. An organic electroluminescence device according to claim 1, wherein the organic electroluminescence element has the structure which emits light in the direction toward the second substrate.

5. An organic electroluminescence device according to claim 1, wherein the organic electroluminescence element has the structure which emits light in the direction toward the first substrate.

6. An organic electroluminescence device according to claim 1, wherein the desiccant is a desiccant member disposed only on the second surface of the second substrate.

* * * * *